Aug. 30, 1966 D. S. LERNER 3,270,346

POLARIZATION-SELECTIVE CONNECTING CIRCUITS FOR IMPEDANCE MATCHING OF ARRAY ANTENNAS

Filed Oct. 25, 1963 4 Sheets-Sheet 1

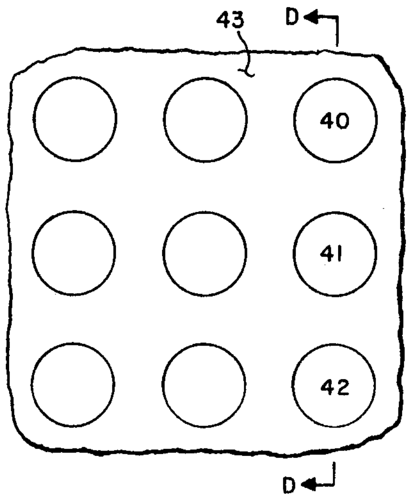
FIG. 2a
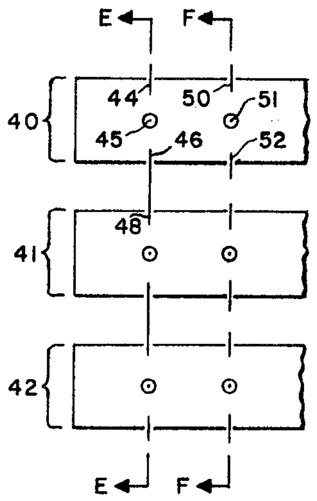
FIG. 2b (DD)
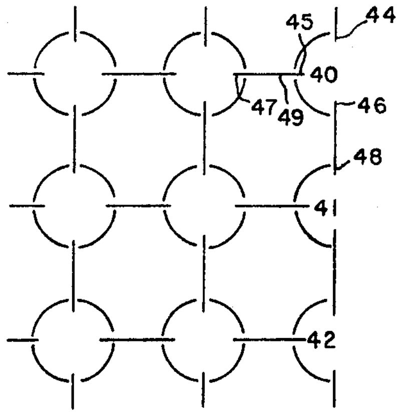
FIG. 2c (EE)
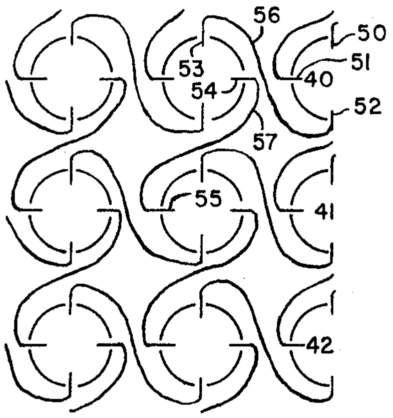
FIG. 2d (FF)

United States Patent Office 3,270,346
Patented August 30, 1966

3,270,346

POLARIZATION-SELECTIVE CONNECTING CIRCUITS FOR IMPEDANCE MATCHING OF ARRAY ANTENNAS

David S. Lerner, Flushing, N.Y., assignor to Hazeltine Research, Inc., a corporation of Illinois Filed Oct. 25, 1963, Ser. No. 318,969
8 Claims. (Cl. 343—777)

Figure 1A:
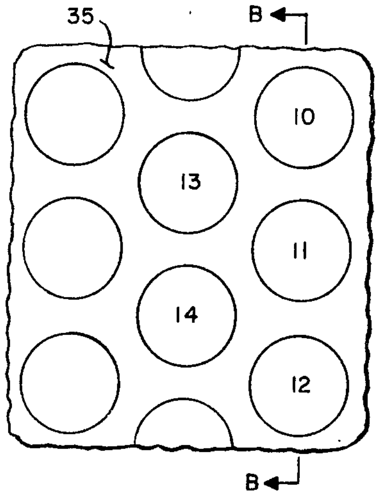

This invention is directed to the impedance matching of array antennas and, more particularly, to closer impedance matching achieved by providing intercoupling paths for energy of predetermined polarizations between branch transmission lines leading to the radiating elements of an array antenna. "Intercoupling Lines for Impedance Matching of Array Antennas" are covered more broadly in an application of that title of P. W. Hannan, Serial No. 248,074, filed December 28, 1962.

The design and construction of electronic systems using array antennas are well-known, as evidenced by the large number of radar and other systems incorporating array antennas which are presently in use. An array antenna may be impedance matched to associated transmitters or receivers, or both, for one beam condition using well known devices such as inductive irises, capacitive screws, etc. If an array is impedance matched to the transmitter, then there is no reflection caused by the array and all of the transmitter power will be radiated. This is true regardless of the type of radiating element that is used (providing, of course, that there is no dissipation loss in the radiating element).

However, for different beam conditions, the impedance match will vary and will not remain constant. Thus in a scanning array antenna, coupling between nearby elements of the array causes a large apparent reflection which varies with the relative phase differences between nearby elements. In other words, the array impedance varies with scan angle because of the coupling between nearby elements and the resulting impedance mismatch reduces the array efficiency. Reflections caused by this varying impedance of the array may also cause unstable operation of associated transmitters or receivers and multiple reflections may also arise and cause spurious antenna beams.

Objects of this invention are to provide new and improved array antennas which avoid one or more disadvantages of prior art antennas and which have closer impedance matching than antennas not utilizing the invention.

In accordance with the invention an array antenna having closer impedance matching comprises a plurality of radiating elements, a plurality of branch transmission lines connecting to the radiating elements, means for exciting the elements through the lines in a plurality of conditions and polarization selective means for providing intercoupling paths between said branch transmission lines for energy of predetermined polarizations so that closer impedance matching results for at least one condition of excitation.

For a better understanding of the present invention, together with other and further objects thereof, reference is had to the following description, taken in connection with the accompanying drawings, and its scope will be pointed out in the appended claims.

Figure 1B:
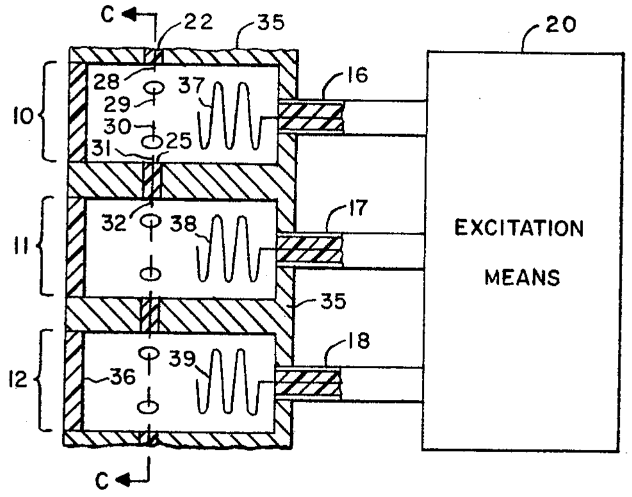
Figure 1C:
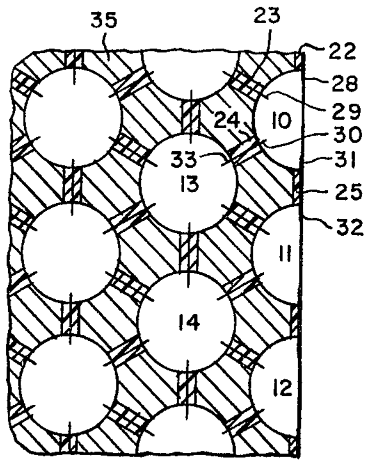

Referring to the drawings:

FIGS. 1*a*, 1*b* and 1*c* are three views of a portion of an array antenna which utilizes the invention;

FIGS. 2*a*, 2*b*, 2*c* and 2*d* are simplified views of a portion of another form of array antenna utilizing the invention;

FIGS. 3, 4, 5, 7*a* and 7*b* are schematic diagrams useful in describing certain principles of the invention, and FIGS. 6*a*, 6*b*, 6*c* and 6*d* are reflection chart diagrams useful in explaining application of the invention.

*FIGS. 1, 1b and 1c*

Referring to FIGS. 1*a*, 1*b* and 1*c* there are shown three views of a portion of an array antenna constructed in accordance with the invention. It will be understood that array antennas commonly use a very large number of radiating elements, however the illustrated portion of an array is sufficient for discussion and understanding of a complete array antenna in accordance with the invention. FIG. 1*a* is a view looking into the radiating end of a portion of a planar array composed of many circular waveguide radiating elements. FIG. 1*a* shows eight circular waveguide radiating elements and portions of two others. FIG. 1*b* is a view of the FIG. 1*a* arrangement taken along the BB section indicated in FIG. 1*a*. Similarly, FIG. 1*c* is a view of the FIG. 1*a* arrangement taken along the CC section indicated in FIG. 1*b*.

The array antenna of FIGS. 1*a*, 1*b* and 1*c* includes a plurality of radiating elements, shown as comprising the ends of a group of circular waveguides, of which waveguides 10–14 are typical. The antenna also includes a plurality of branch transmission lines, shown as a group of coaxial lines and waveguides connected thereto, of which coaxial lines 16–18 and waveguides 10–12 are typical. (Coaxial lines connecting to other waveguides, such as 13 and 14, which would be visible to the FIG. 1*b* view have been omitted from FIG. 1*b* to avoid confusion in the drawing.)

The array antenna of FIGS. 1*a*, 1*b* and 1*c* further includes means for exciting the radiating elements, such as 10–14, through the coaxial lines, such as 16–18, in a variety of conditions. These means are represented by rectangle 20 which may include a network of transmission lines and associated components for connecting between the group of transmission lines such as 16–18 and transmitters or receivers, or both, so as to allow the elements 10–14 to be excited in a plurality of different conditions. As already noted, the construction and operation of systems utilizing array antennas are well known so that the makeup of excitation means 20 need not be discussed in detail.

The array antenna as shown, further includes polarization selective means for providing intercoupling paths between the waveguides 10–14 of the branch transmission lines for energy of predetermined polarization. These means are illustrated as including a group of dielectric-filled coaxial transmission lines, of which 22–25 are typical, and a group of electric probes, of which 28–33 are typical. As shown in FIG. 1*c*, each transmission line (such as 24) has an electric probe (such as 30 and 33) at each end, protruding into the circular waveguide involved (such as 10 and 13).

Structurally, the array antenna of FIGS. 1*a*, 1*b* and 1*c* consists of a metallic block 35, having circular holes forming circular waveguides such as 10–14. Each circular waveguide is shown as being covered by a dielectric cover (such as 36, in waveguide 12, which is typical) which acts as a protective window to provide protection against environmental factors while appearing substantially invisible to electromagnetic waves. The transmission lines 16–18 connect to the opposite ends of the waveguides 10–12 from the covers such as 36. Each of the center conductors of the transmission lines 16–18 is shown as terminating in a self-supporting helix (37–39).

In operation, an array antenna such as shown in FIGS. 1*a*, 1*b* and 1*c* can be caused to provide a scanning beam by varying the relative phase of the excitation of the radiating element. This is done by exciting the transmission lines 16–18 in a continuous sequence of phasing conditions. The helixes 37–39 then act to launch a circularly polarized wave in each of the circular waveguides. In this way the radiating elements, which are the ends of the circular waveguides such as 10–14 in this case, are excited in a continuous sequence of phasing conditions. Each such condition will normally involve a linear progression of phase across the array corresponding to a particular scan angle. In a typical case the radiated beam may be caused to scan from broadside, to 45° off broadside. So far this description of operation relates equally to prior art antennas and to the present invention. The difference is that in prior art antennas the impedance has varied greatly with scan angle, as previously noted.

Ordinary matching structures can be utilized to achieve impedance matching only for a single scan angle (typically broadside) because the effect of such structures remains the same for all scan angles. This is more or less the crux of the problem: the impedance varies with scan angle, but prior matching arrangements produce an effect which remains constant for all scan angles. In accordance with the present invention, polarization selective means such as the combination of transmission line 24 and electric probes 30 and 33, are used to provide a matching effect which varies with the excitation condition so as to provide closer impedance matching for a number of excitation conditions, thereby improving the performance of the array antenna.

With reference to FIGS. 1*a*, 1*b* and 1*c* at any scan angle other than broadside (which will be assumed to be the angle matched using well-known matching techniques) the reflection from the array is different for E-field components in the plane of scan and E-field components perpendicular to the plane of scan. In order to impedance match the array at various scan angles, it is therefore desirable to use a matching device which provides a different effect for each of the two E-field components. In accordance with the invention, this is accomplished by using polarization selective means providing intercoupling paths that are sensitive to one polarization and insensitive to the crossed polarization. In the illustrated embodiment this is accomplished by means of electrical probes and coaxial transmission lines. This arrangement provides an effect which acts principally on the E-field components in the plane of scan (the plane of scan being that plane defined by the broadside direction and the beam direction) and which varies with the scan angle.

*FIGS. 2a, 2b, 2c* and *2d*

In some applications it may be desirable to obtain additional control of the impedance matching by adding additional sets of polarization selective means providing intercoupling paths. This may be done by providing additional electric probe arrangements in the same pattern as illustrated or betewen different combinations of elements, as between waveguides 10 and 14, 12 and 13, etc., of FIG. 1*a* for example. In addition, known types of devices sensitive to the magnetic field, which have their greatest effect for the E-field components perpendicular to the plane of scan, can be utilized. Combinations of two different types of polarization selective means sensitive to the electric and magnetic fields permit impedance matching over a wide range of scan angles.

Referring now to FIGS. 2*a*, 2*b*, 2*c* and 2*d*, there are shown simplified views of a square-type array of circular waveguide radiating elements with two separate sets of polarization selective means providing intercoupling paths. FIG. 2*a* is a view corresponding to the FIG. 1*a* view, showing the front of a square-type array of circular waveguide radiating elements, of which 40–42 are typical (FIG. 1*a* showed what will be called a triangular-type array).

FIG. 2*b* is a sectional view corresponding to the DD section in FIG. 2*a*. FIG. 2*b* can be considered to be similar to the portion of FIG. 1*b* appearing to the left of the helixes 37–39. FIG. 2*b* is a simplified drawing, in that the metallic block 43 (corresponding to 35 in FIG. 1*b*) has been omitted and the circular waveguides 40–42 are represented by thin shells.

FIG. 2*c* corresponds to section EE in FIG. 2*b* and shows an intercoupling arrangement of electric probes, such as 44–48, interconnected by transmission lines of which only the center conductors are shown. FIG. 2*c* is a simplified drawing, if all details were shown FIG. 2*c* would resemble FIG. 1*c*. The probes, such as 44–48, are interconnected so as to have their greatest effect for the E-field components parallel to the plane of scan.

FIG. 2*d* corresponds to section FF in FIG. 2*b* and shows an intercoupling arrangement of electric probes, such as 50–55, which are interconnected so as to have their greatest effect for the E-field components perpendicular to the plane of scan. It will be appreciated that FIG. 2*d* has been simplified in the same manner as FIG. 2*c* and that the interconnecting lines, such as 56 and 57, are actually dielectric-filled coaxial lines in this example.

The arrangement of FIGS 2*a*, 2*b*, 2*c* and 2*d* provides additional control of impedance matching by utilizing two independent sets of electric probes, each set interconnected in a different manner. It will be obvious to workers skilled in the antenna field that devices sensitive to the magnetic field could have been used in place of one or both of the electric probe arrangements of FIG. 2*d*.

A detailed analysis of the design and placement of polarization sensitive intercoupling arrangements is not required here. Once a worker skilled in the design of prior art array antennas appreciates the basic principles of polarization selective intercoupling arrangements in accordance with the invention, he can then apply the invention using known antenna design technology. The basic principles will be discussed in greater detail in the following section.

For the purposes of this specification, the term "transmission line" is used as a generic term which encompasses waveguides, coaxial lines and other means for guiding electromagnetic waves from one point to another. Also, in this specification, antennas and components thereof are at times described using terms relating to transmission, rather than reception, however such usage is relied on merely for ease of description and it must be understood that reciprocity applies and the principles involved apply equally to reception and transmission.

*FIGS. 3–7b*

The antenna of FIGS. 2*a*, 2*b*, 2*c* and 2*d* can be analyzed by considering any operating polarization to consist of two components, a horizontal component and a vertical component. Four principal scan conditions and four groups of electric probes which are principally involved for those conditions can be stated as follows. (1) If a left-to-right scan is involved and we consider the vertical component, the principal effect is produced by the group of probes of which 50, 52 and 53 are typical. (2) For left-to-right scan and the horizontal component, the principal effect is produced by the group of probes of which 45 and 47 are typical. (3) For top-to-bottom scan and the vertical component, the principal effect is produced by the group of probes of which 44, 46, and 48 are typical. (4) For top-to-bottom scan and the horizontal component, the principal effect is produced by the group of probes of which 51, 54 and 55 are typical. For circular polarization and a plane of scan at 45° to the horizontal, all four groups of probes would provide effects of equal magnitude to result in closer impedance matching.

By considering separately each of the four groups of probes discussed above, the basic principles involved will now be discussed in greater detail.

Figure 3:
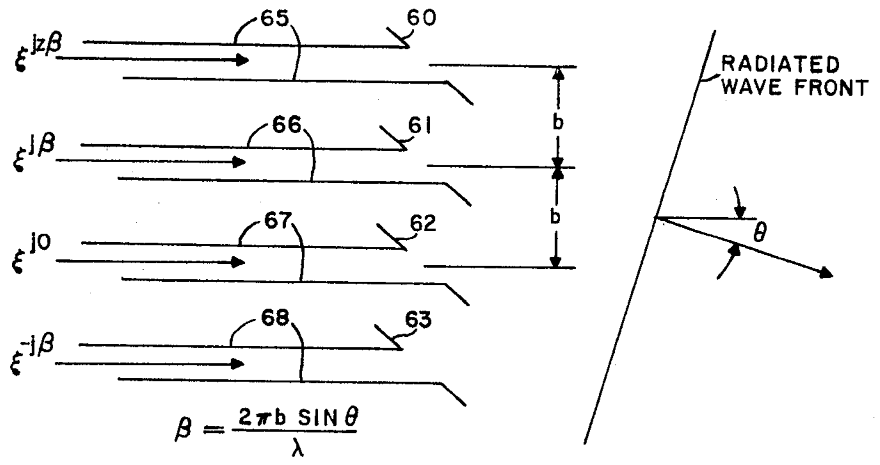

In a scanning array antenna, the scan angle is related to the phase of excitation between adjacent radiating elements. This relationship is indicated in FIG. 3 for a linear array of simple dipoles 60–63 fed by two-wire transmission lines 65–68, respectively. In FIG. 3, $b$ is the distance between adjacent dipoles, $\theta$ is the scan angle relative to broadside, $\beta$ is the phase difference between excitation of adjacent elements, and $\lambda$ is the operating wavelength.

Figure 4:
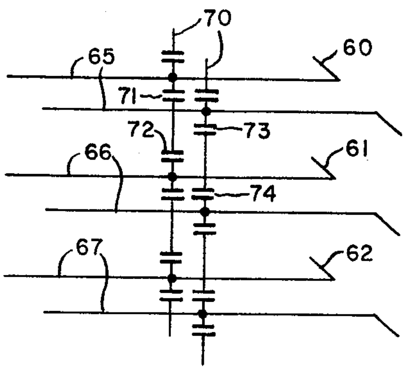

FIG. 4 shows a connecting transmission line 70 (including a group of capacitances of which 71–74 are typical) which connects adjacent element lines 65–67 of a large linear array antenna, portions of which are shown in FIGS. 3 and 4. FIG. 4 shows the essential circuit involved for a single line of radiating elements when any one of the four groups of probes enumerated above are taken separately. FIG. 4 shows the circuit involved for conditions 1 and 4 above; for conditions 2 and 3, the dipoles would be rotated 90° so as to be vertical instead of horizontal as shown. (For the proper spatial orientation for conditions 1 and 2, FIG. 4 must be rotated 90° so that the elements 60, 61 and 62 lie in a horizontal plane.) The capacitances such as 71–74 represent the effect of the electric probes of FIGS. 2*c* and 2*d* and the interconnecting portions of balanced two-wire transmission line 70 represent the lines interconnecting the probes. The dipoles 60–62 represent the circular waveguide radiating elements for one particular polarization. The principles to be discussed apply to arrangements using electric probes, to arrangements using devices sensitive to the magnetic field and to arrangements using combinations thereof.

Since the phase of the voltage across the line 70 in FIG. 4 is specified for a particular scan angle $\theta$ as indicated in FIG. 3, the complex ratio of upward to downward traveling waves in line 70 may be determined. This permits determination of the net current $I_c$ flowing from an element line, such as 66, into the connecting line 70, which in turn permits determination of the admittance introduced across the element line by the connecting line.

Figure 5:
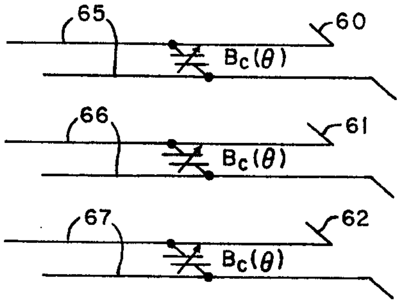

Such determination shows that this admittance is a pure susceptance which will be called $B_c$. This result correlates with the desired condition that the net up or down flow of power in the line 70 be negligible compared with the total power supplied to the array via the lines 65–67. The susceptance $B_c$ is given by the following relation:

$$B_c = k_1 + k_2 \cos \beta \qquad (1)$$

where $$\beta = \frac{2b\pi \sin \theta}{\lambda}$$

and $k_1$ and $k_2$ are constants determined by the particular arrangement involved. Since $\beta$ varies with scan angle, the susceptance is angle-dependent as desired. This is indicated in FIG. 5 which shows the equivalent circuit of the connecting line in the array antenna.

To illustrate the capability of the connecting-line technique for matching an array antenna at two values of scan angle, an example will be presented. This example outlines one possible series of steps that could be followed in accordance with the invention to achieve the specified result, without considering optimum configurations or practical values. The individual steps can be accomplished using well-known techniques so as to achieve the overall result in accordance with the invention.

Figure 6A:
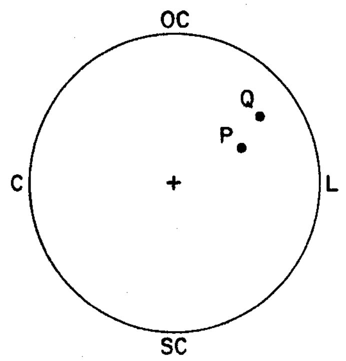
Figure 6B:
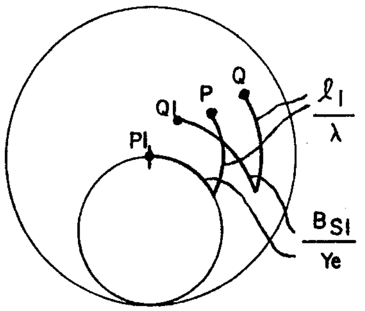
Figure 6C:
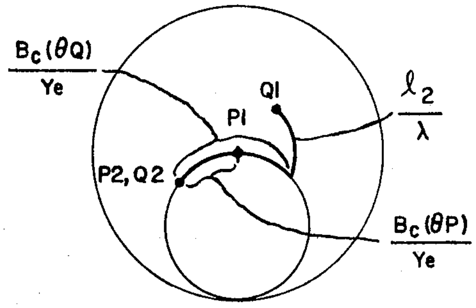
Figure 6D:
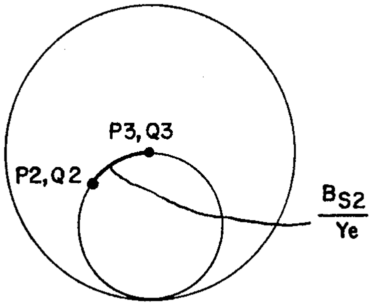

In FIG. 6*a* are shown a pair of points P and Q on the reflection chart, representing the impedance of an array antenna at two different scan angles. First, point P can be matched by introducing a constant shunt susceptance, $B_{s1}$, at the proper location on the exciting line; this is indicated in FIG. 6*b*. The admittance P is shown matched at $P_1$, and the corresponding shift of admittance Q is shown at $Q_1$. Next, an angle-dependent shunt susceptance $B_c(\theta)$ is introduced at a second line location which would permit point Q to be matched by a shunt susceptance. However, the angle dependency, $K_2 \cos \beta$, is specified such that the change in susceptance between angle P and Q equals the negative of the susceptance of point Q at this location. This merges the two points, as shown in FIG. 6*c*. Finally, the constant shunt susceptance, $B_{s2}$, is inserted at this same second line location to match both points, as shown in FIG. 6*d*.

Figure 7A:
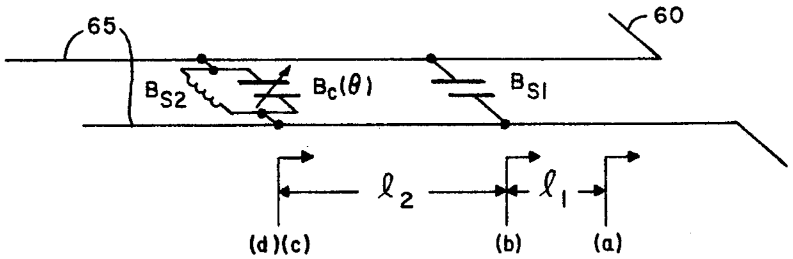
Figure 7B:
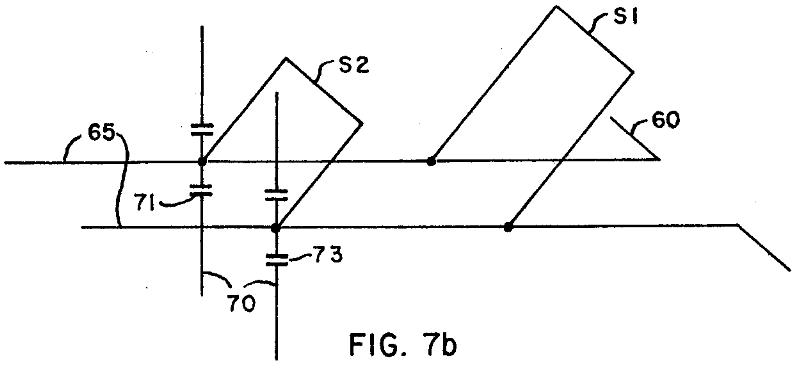

The equivalent circuit for this matching system is indicated in FIG. 7*a*. As illustrated in FIG. 7*b*, the angle dependent susceptance $B_c(\theta)$ of FIG. 7*a* is provided by connecting line 70, while the constant susceptances $B_{s1}$ and $B_{s2}$ of FIG. 7*a* can be provided by stub lines (short-circuited lines) S1 and S2.

It should be mentioned that the stub line S2 which is coincident with the connecting line may not be necessary. Formula 1 shows that the connecting line provides a constant term in addition to the angle-dependent term of susceptance, and these terms can be controlled separately in the design of the line. However, it may be preferable to make use of the line characteristic to achieve wide band operation for some other feature.

Polarization selective coupling means, such as the electric probes discussed in detail above, allow the above analysis to be applied to two crossed polarizations so as to achieve closer impedance matching. In a square type array such as shown in FIG. 2*a*, the crossed polarizations can be treated independently of each other. In a triangular type array such as shown in FIG. 1*c*, the probes of each group are not perpendicular to the probes of the other groups, so that no matter how the two crossed polarizations are chosen some of the probes will produce effects on both of the crossed polarizations. However, if two sets of polarization selective devices are used (as in FIG. 2*b*) there are sufficient variables to allow matching the two crossed polarization components. The two sets used may comprise two sets of electric probes (as in FIG. 2*b*), two sets of magnetic coupling devices or a combination of electric and magnetic devices.

The technique for impedance matching an array antenna by means of connecting line between the element lines does not interfere with the radiating region of the antenna. Therefore, the radiating elements may be designed to achieve some other property, such as a particular polarization pattern, mechanical ruggedness, or constructional simplicity.

The achievement of matching at two values of scan angle represents a significant improvement over the usual single-angle match. With perfect match at two angles, it is likely that the antenna will be reasonably well matched over the range of angles between the two angles.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

What is claimed is:

1. An array antenna having closer impedance matching comprising:
- a plurality of radiating elements;
- a plurality of branch transmission lines connecting to said radiating elements;
- means for exciting said elements through said lines in a plurality of conditions;
- and polarization selective means for providing intercoupling paths between said branch transmission lines for energy of predetermined polarizations so that closer impedance matching results for at least one condition of excitation.

2. An array antenna in accordance with claim 1, wherein the polarization selective means comprise a plurality of dielectric-filled coaxial transmission lines and a plurality of electric probes, one probe coupled to each end of the center conductor of each of said coaxial transmission lines.

3. An array antenna having closer impedance matching comprising:

a plurality of radiating elements;

a plurality of branch transmission lines connecting to said radiating elements;

means for exciting said elements through said lines in a plurality of conditions;

and a plurality of independent sets of polarization selective means for providing intercoupling paths between said branch transmission lines for energy of predetermined polarizations so that closer impedance matching results for at least one condition of excitation.

4. An array antenna in accordance with claim 3, wherein the polarization selective means comprise a plurality of dielectric-filled coaxial transmission lines and a plurality of electric probes, one probe coupled to each end of the center conductor of each of said coaxial transmission lines.

5. An array antenna having closer impedance matching comprising:

a plurality of radiating elements;

a plurality of waveguides connecting to said radiating elements;

means for exciting said elements through said waveguides in a plurality of conditions;

and a plurality of transmission lines connecting each said waveguide to the waveguides in the nearest adjacent rank, each transmission line terminating at each end in polarization selective means for coupling only energy of a predetermined polarization;

the antenna being so constructed and arranged that closer impedance matching results for at least one condition of excitation.

6. An array antenna in accordance with claim 5, wherein the polarization selective means comprise a plurality of dielectric-filled coaxial transmission lines and a plurality of electric probes, one probe coupled to each end of the center conductor of each of said coaxial transmission lines so that said probe protrudes into the waveguide involved.

7. An array antenna having closer impedance matching comprising:

a plurality of radiating elements;

a plurality of waveguides connecting to said radiating elements;

means for exciting said elements through said waveguides in a plurality of conditions;

and a plurality of independent sets of transmission lines connecting each said waveguide to the waveguides in the nearest adjacent rank, each transmission line terminating at each end in polarization selective means for coupling only energy of a predetermined polarization;

the antenna being so constructed and arranged that closer impedance matching results for at least one condition of excitation.

8. An array antenna in accordance with claim 7, wherein the polarization selective means comprise a plurality of dielectric-filled coaxial transmission lines and a plurality of electric probes, one probe coupled to each end of the center conductor of each of said coaxial transmission lines so that said probe protrudes into the waveguides involved.

No references cited.

HERMAN KARL SAALBACH, *Primary Examiner.*

R. D. COHN, *Assistant Examiner.*